United States Patent [19]
Brehm et al.

[11] Patent Number: 4,481,487
[45] Date of Patent: Nov. 6, 1984

[54] MONOLITHIC MICROWAVE WIDE-BAND VCO

[75] Inventors: Gailon E. Brehm, Plano; Bentley N. Scott, Richardson, both of Tex.

[73] Assignee: Texas Instruments Incorporated, Dallas, Tex.

[21] Appl. No.: 293,040

[22] Filed: Aug. 14, 1981

[51] Int. Cl.$^3$ .................. H01L 27/04; H03B 5/00
[52] U.S. Cl. .................. 331/117 D; 331/177 V; 357/14; 357/15; 357/22; 357/41; 357/51
[58] Field of Search ............ 331/108 C, 108 D, 96, 331/117 FE, 117 D, 177 V; 357/41, 46, 14, 51, 15, 22; 334/14, 15

[56] References Cited

U.S. PATENT DOCUMENTS

| | | | |
|---|---|---|---|
| 3,544,892 | 12/1970 | Gallagher et al. | 357/14 |
| 3,675,161 | 7/1972 | Teramoto et al. | 357/14 |
| 3,749,987 | 7/1973 | Anantha | 357/14 |
| 3,767,984 | 10/1973 | Shinoda et al. | 357/15 |
| 4,135,168 | 1/1979 | Wade | 357/15 |
| 4,150,344 | 4/1979 | Fenk | 331/108 C |
| 4,156,249 | 5/1979 | Koo | 357/14 |
| 4,189,682 | 2/1980 | Sechi | 331/108 C |
| 4,189,688 | 2/1980 | Sechi et al. | 331/177 V |
| 4,237,473 | 12/1980 | Chiang | 357/22 |
| 4,375,621 | 3/1983 | Schneiter et al. | 331/177 V |

OTHER PUBLICATIONS

Maeda et al., "Design & Performance of X-Band Oscillators with GaAs Shottky-Gate FET", IEEE Microwave Theory and Tech., vol. MTT-23, No. 8, 8/75, pp. 661-667.

Wade, "X-Band Reverse Channel GaAs FET Power VCO", Microwave Journal, vol. 21, 4/78, p. 92.

Rauscher, "Broadband Varactor-Tuned GaAs FET Oscillator", Electronic Letters, vol. 16, No. 14, 7/80, pp. 534-535.

Rausher, "Large Signal Tech. for Designing Single-Frequency & Voltage-Controlled GaAs FET Oscillators", IEEE Microwave Theory & Tech., vol.-MTT29, No. 4, 4/81.

Scott et al., "Octive Band Varactor-Tuned GaAs FET Oscillators" IEEE International Solid-State Circuits Conference, 2/81, pp. 138-139.

Johnson, "Microwave Varactor Tuned Transistor Oscillator Design", IEEE Microwave Theory and Tech., vol. MTT-14, No. 11, Nov. 66, pp. 564-572.

*Primary Examiner*—John S. Heyman
*Assistant Examiner*—Timothy P. Callahan
*Attorney, Agent, or Firm*—Robert Groover; Melvin Sharp; James T. Comfort

[57] ABSTRACT

A monolithic microwave voltage-controlled oscillator including one or more FETS integrated with a wide-ratio varactor. The varactor includes interdigitated anode and cathode patterns laid out on a single thin epitaxial layer. The punch through voltage of the epitaxial layer, and hence the resistivity-thickness product of the epitaxial layer, must be low. Since the substrate is semi-insulating, punch through to the substrate does not become uncontrollable, but simply permits modulation of the capacitance over a very wide range. The FETS are formed in the same epitaxial layer with the varactor, and complicated doping profiles are not required.

23 Claims, 5 Drawing Figures

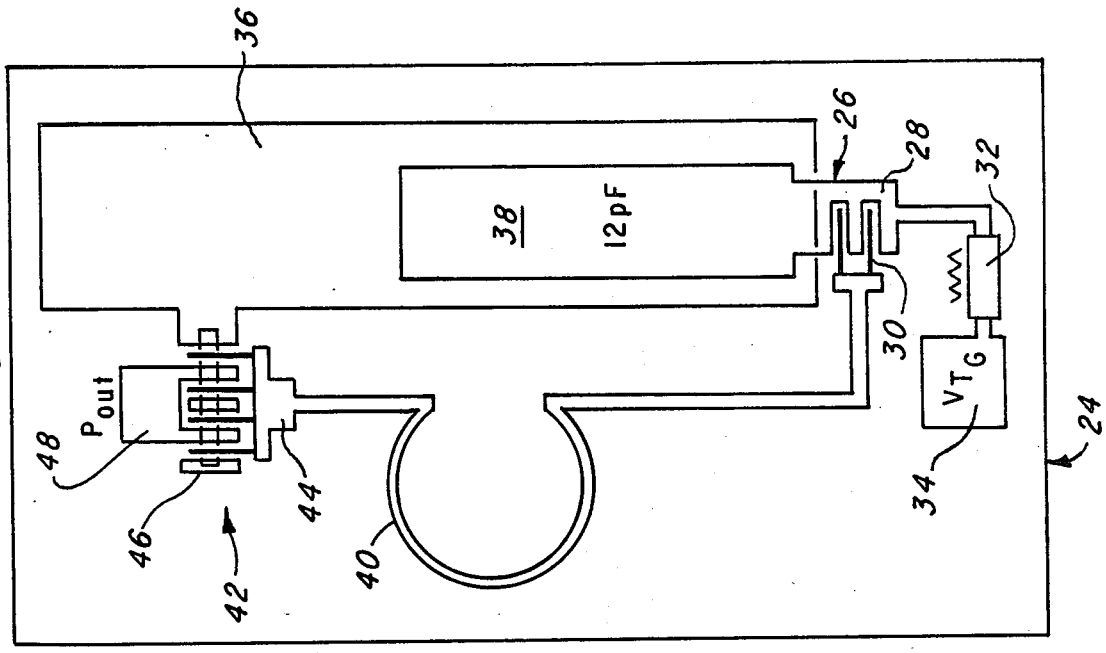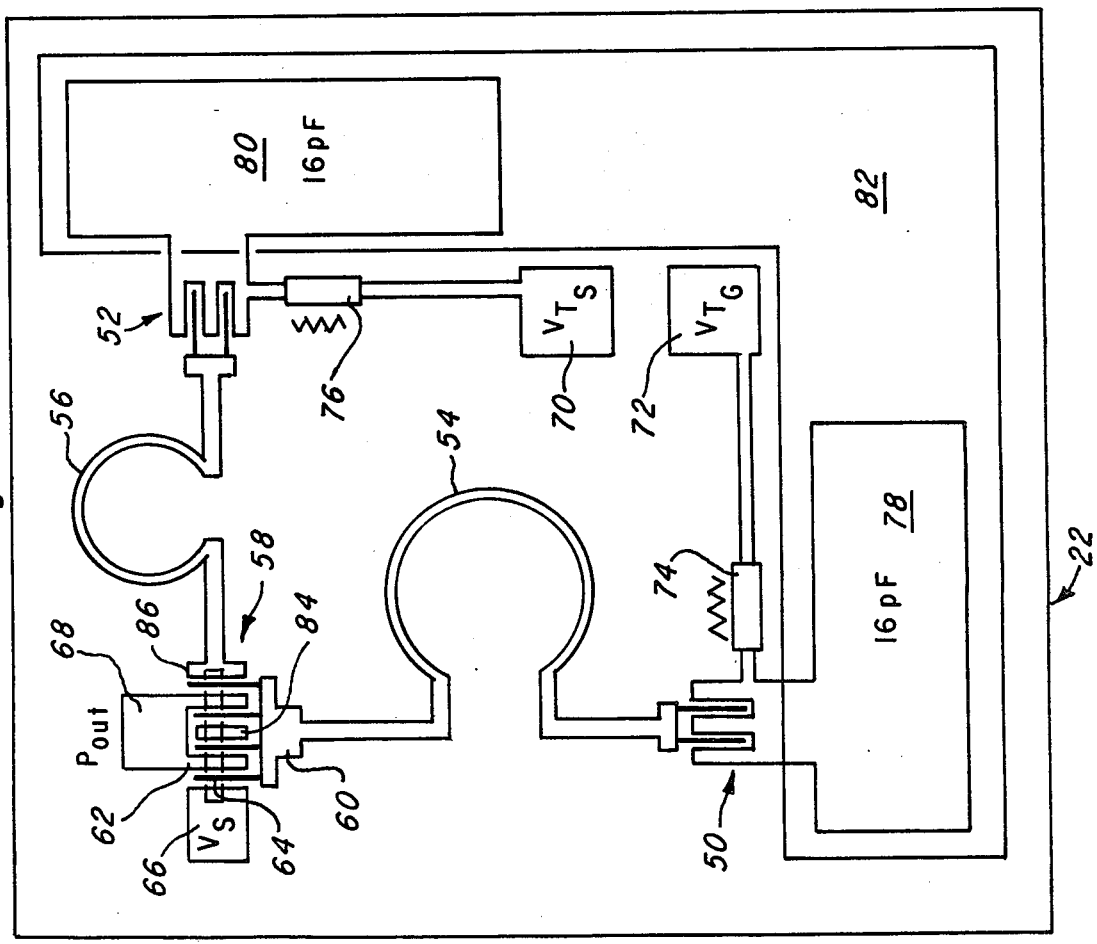

MONOLITHIC MICROWAVE WIDE-BAND VCO

CROSS-REFERENCE TO RELATED APPLICATIONS

The following applications of common assignee and filed concurrently with the present application contain related subject matter and are hereby incorporated by reference: TI-8887, Wide-Ratio Monolithic Microwave Varactor; TI-8990, Varactor Trimming for MMICs; TI-9001, Self-Biasing for FET-Driven Microwave VCOs.

BACKGROUND OF THE INVENTION

The present invention integrates a varactor diode which has a very large tuning ratio (i.e. a wide-ratio diode) in a monolithic microwave integrated circuit (MMIC), to provide a wide-band microwave voltagecontrolled oscillator (VCO).

Conventional varactor diodes, particularly those with large tuning ratios (hyperabrupt diodes) require highly conductive substrate material and relatively thick epitaxial layers (greater than one micron). These material requirements are not compatible with the requirements of GaAs FET-monolithic microwave integrated circuits (MMICS) which require a thin (less than one-half micron) uniformly doped active layer on a semi-insulating substrate. To integrate the conventional hyperabrupt diode on a semi-insulating substrate requires a very complicated selective epitaxial deposition, wherein certain areas of the substrate surface receive one epitaxial layer, and other areas receive a different epitaxial layer. The materials required to implement a varactor in an MMIC should be the same as or similar to those for an FET, so that varactors can easily be integrated in, e.g., monolithic microwave voltage controlled oscillators.

Thus, it is an object of the present invention to provide a monolithic microwave integrated circuit incorporating a wide-ratio varactor in a thin uniformally doped active layer above a semi-insulating substrate.

R. VanTuyl, "A Monolithic GaAs FET RF Signal Generation Chip", *ISSCC-80 Digest* 118 (which is hereby incorporated by reference) discloses a gallium arsenide varactor diode in an MMIC which is integrated in a thin epitaxial layer on a semi-insulating substrate. The VanTuyl device does not, however, provide very wide capacitance tuning characteristics. A wide capacitance range (of a decade or more) is essential for many microwave applications. In addition, the VanTuyl device is designed for operation only at lower microwave frequencies (of at most 4 GHz).

The frequency tuning range of a varactor-based VCO is much narrower than the capacitance range of the tuning varactor, due to the inherent and parasitic reactance characteristics of FETs and other components of the VCO. In particular, an extremely wide-range varactor (having a capacitance ratio of a decade or more) is needed if the frequency range of the VCO is to remotely approach one octave.

Thus, it is an object of the present invention to provide a VCO having a tuning range of 1.5 to 1 or larger at microwave frequencies. It is a further object of the present invention to provide a VCO having a tuning range of 1.3 to 1 or better at microwave frequencies above 5 GHz.

It is a further object of the present invention to provide a microwave VCO having a tuning range of an octave or more.

It is a further object of the present invention to provide a monolithic microwave VCO having a tuning range of 1.5 to 1 or larger.

A major difficulty which arises in microwave VCOs having such a large frequency range is maintaining the correct impedance match to achieve the maximum obtainable bandwidth. Mismatch can easily become such as to gravely impair performance.

However, in a monolithic microwave integrated circuits even trimming (to achieve impedance match at one particular frequency) is difficult, and optimal matching over a wide range of frequencies is presently impossible.

Thus, it is a further object of the present invention to provide means for maintaining impedance matching of a monolithic microwave wide-band VCO over a very large frequency range.

At the present, YIG devices provide the only practical means of wide tuning at higher microwave frequencies, e.g., 10 GHz. However, not only do such YIG structures require very complex magnetic-field-controlled tuning structures, but also the capacitance (or frequency) change permitted by YIG devices is very slow, on the order of a millisecond or more.

Thus, it is a further object of the present invention to provide a microwave reactance which can be tuned over an extremely wide range with great rapidity. In particular, it is an object of the present invention to provide a microwave reactance which can be tuned over a wide range with great rapidity at frequencies in excess of 5 GHz.

Some examples of prior art integrated varactors include: U.S. Pat. Nos. 3,396,312 to Vendelin, 3,559,005 to Vandelin et al, and 3,636,420 to Vandelin et al.

SUMMARY OF THE INVENTION

The wide-range integrated varactor used in the VCO of the present invention includes an interdigitated anode and cathode on a thin epitaxial or implanted layer on a semi-insulating substrate. The epitaxial layer must have a small doping-thickness product, so that punchthrough occurs before breakdown. Preferably the anode forms a Schottky barrier with the epitaxial layer. Preferably, the substrate is Cr-doped GaAs, and the epitaxial layer is n-type GaAs. As punch-through occurs, the effective area of the anode (and hence the capacitance) changes from a large depletion boundary below the surface anode to an approximately vertical section through the epitaxial layer. Since the substrate is semi-insulating, punch-through does not become catastrophic.

In the preferred embodiment, two such monolithic varactors are integrated with one FET. One of the varactors is used to provide the necessary variable capacitance for the VCO, and the other varactor is used to maintain impedance matching in the source circuit of the VCO. In addition, conventional reactive elements are also used to provide matching.

According to the present invention, there is provided: a monolithic microwave voltage-controlled oscillator (VCO), comprising: a semi-insulating substrate; a doped semiconducting layer above said substrate; an FET atop said semiconductor layer, said FET comprising a mutually interdigitated source and drain, and a gate interposed between said source and said drain; an input contact connected to a first one of said source and said drain, and an output contact connected to the other one of said source and said drain; a varactor, comprising an anode and a cathode atop said semiconducting layer, said anode forming a Schottky barrier with said semiconducting layer, the portion of said semiconducting layer beneath said anode being sufficiently thin and sufficiently lightly doped that punch through between said anode and said substrate occurs at a lower voltage than does breakdown between said anode and said cathode; and means for providing a bias voltage, connected to a first one of said anode and said cathode of said varactor, said gate of said FET being connected to the other one of said anode and said cathode of said varactor.

BRIEF DESCRIPTION OF THE DRAWINGS

The present invention will be described with reference to the accompanying drawings, wherein.

DESCRIPTION OF THE PREFERRED EMBODIMENTS

Figure 1:
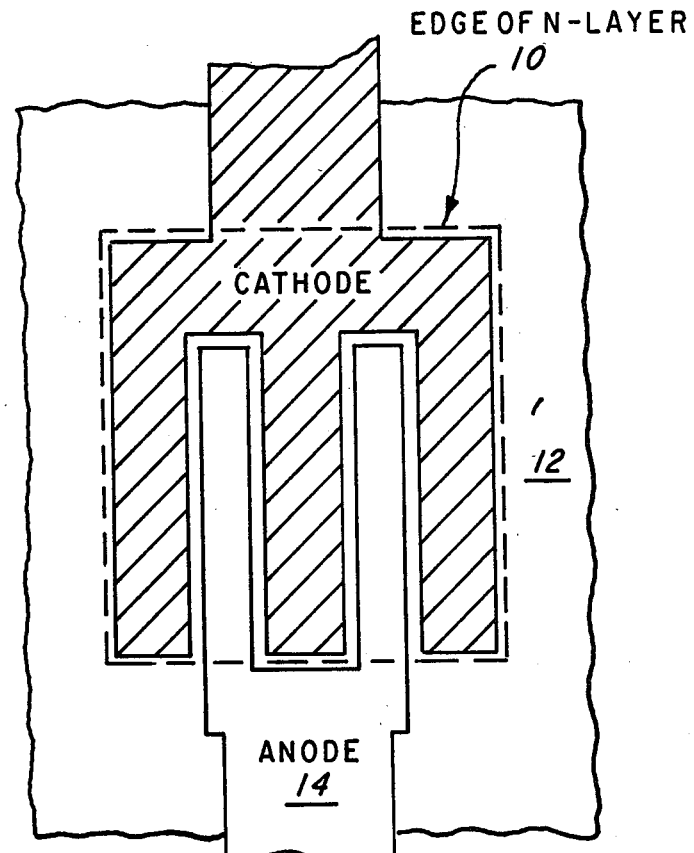
FIG. 1 is a top view of the varactor diode used in the present invention.

FIG. 1 is a top plan view of the varactor used in the present invention. Ion implantation (e.g., $5 \times 10^{12}/cm^2$ of Si at 200 keV) forms an n-type layer 10 on a semi-insulating substrate (preferably Cr-doped GaAs). Alternatively epitaxial growth may be used to form the layer 10. An anode 14 and a cathode 16 are then formed in an interdigitated relation above the n-type layer 10. The anode forms a Schottky barrier with respect to the n-type layer 10, and the cathode 16 forms an ohmic contact.

Each finger of the anode is preferably 6 microns wide and 150 microns long. The anode is a deposited layer of, for example, Ti/Pt/Au. The spacing between the anode and cathode is nominally 2 microns.

Figure 2:
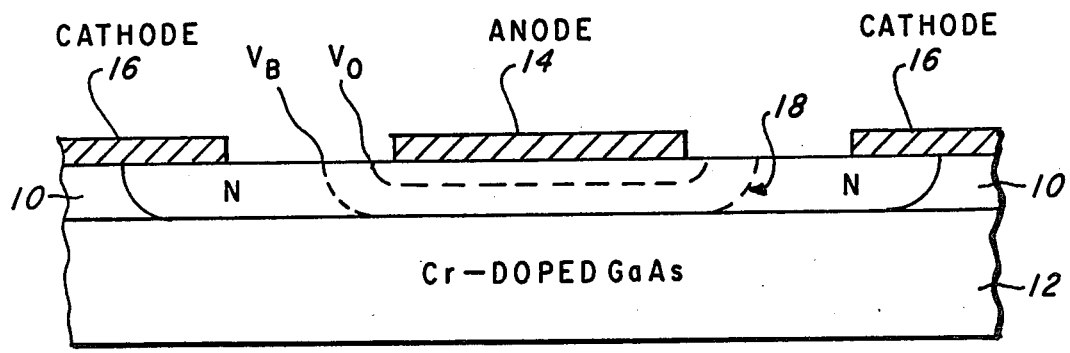
FIG. 2 is a cross-sectional elevation of one finger of the varactor diode used in the present invention.

FIG. 2 shows a cross section across one finger of the anode 14 and portions of two fingers of the cathode 16. The dotted lines $V_0$ and $V_b$ show the respective depletion regions adjacent the anode at 0 volts and at the breakdown voltage, respectively. As these curves show, the effective area of the anode between the punch through voltage and the breakdown voltage is limited to only the approximately vertical portion 18 of the depletion boundary $V_b$. By contrast, at 0 bias the anode 14 has the effective area shown by the depletion boundary $V_0$, which is slightly larger than the physical area of the anode 14 itself.

Thus, a wide capacitance ratio is achieved, because the doping/thickness product of the epitaxial layer 10 is controlled to allow punch through before breakdown. In the preferred embodiment, the layer 10 is 300 nanometers thick. If the thickness is greater than 300 nm, the concentration of impurities should be reduced proportionately. At punch through, the effective diode area is reduced to that of the sidewall. As a result, a very large capacitance ratio is achieved by proper choice of the geometry.

In practice, a tradeoff must be made between the Q and the capacitance ratio. The Q is limited by the parasitic series resistance for current flowing laterally under the anode before punch-through. Since the current beneath the anode is confined to the region of epitaxial layer 10 which lies beneath the depletion boundary and this layer becomes thinner as the depletion boundary approaches punch-through, a large effective series resistance appears just before punch-through.

After punch-through, this series resistance is reduced to that of only the region from the vertical depletion boundary 18 to the cathode 16, and very high Q's are observed. This series resistance is, of course, larger if the finger width is larger.

To reduce the punch-through voltage, a recess may be etched out under the whole surface of the anode, before the anode metallization is deposited. Thus, for example, where the layer 10 is 300 nanometers thick, 100 nanometers would be etched away before the anode is deposited. Thus, the punch-through voltage is reduced, since the anode is accordingly closer to the substrate, whereas the breakdown voltage is not reduced, since the anode is no closer to the cathode. In fact, the breakdown voltage may be slightly increased, since the surface portions of the layer 10 are likely to be slightly more heavily doped than the lower portions of the layer 10. Since such recessed structures are frequently used for the channel regions of microwave FETs, to reduce the series resistance of the source and drain regions adjacent the channel, such an anode recess is also compatible with familiar microwave integrated circuit technology. An anode which is recessed in this fashion, to approximately ⅓ of the depth of the layer 10, constitutes the presently preferred embodiment of the varactor.

Figure 3:
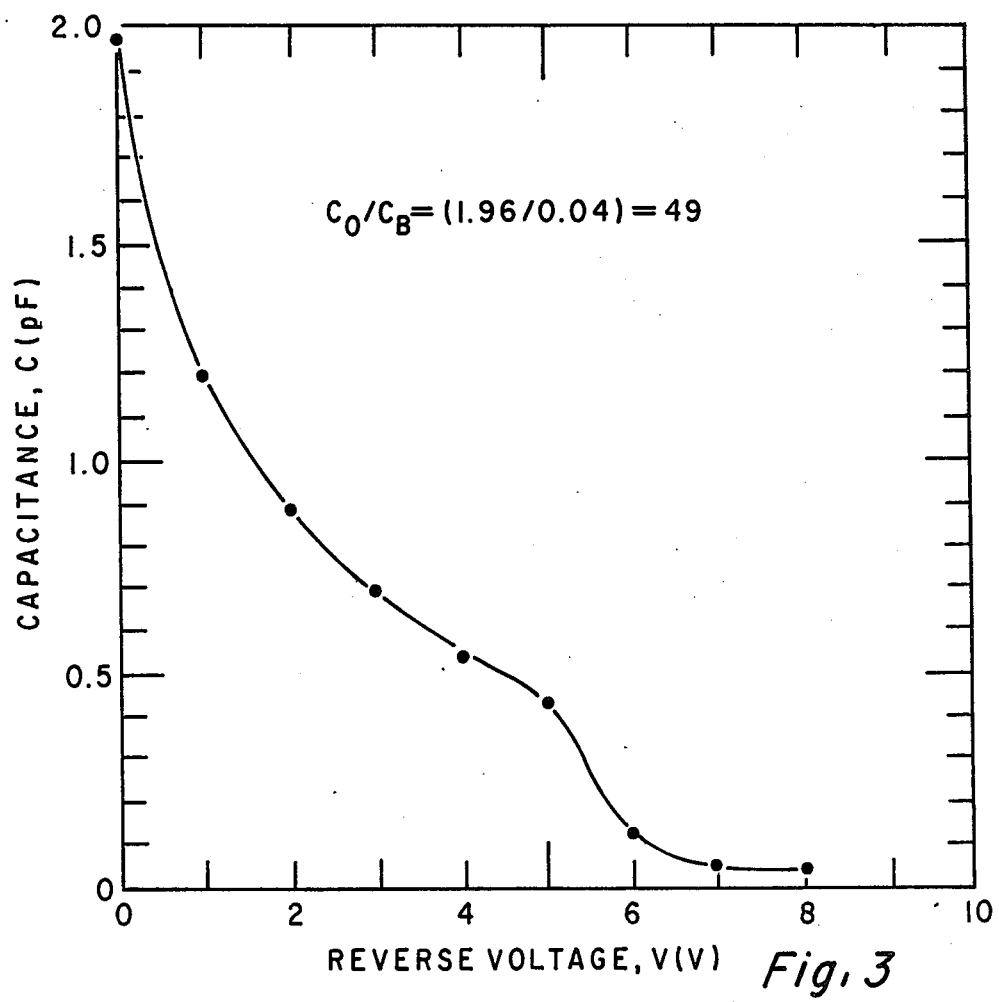
FIG. 3 shows a sample capacitance/voltage curve of the varactor formed according to the present invention.
Figure 4:
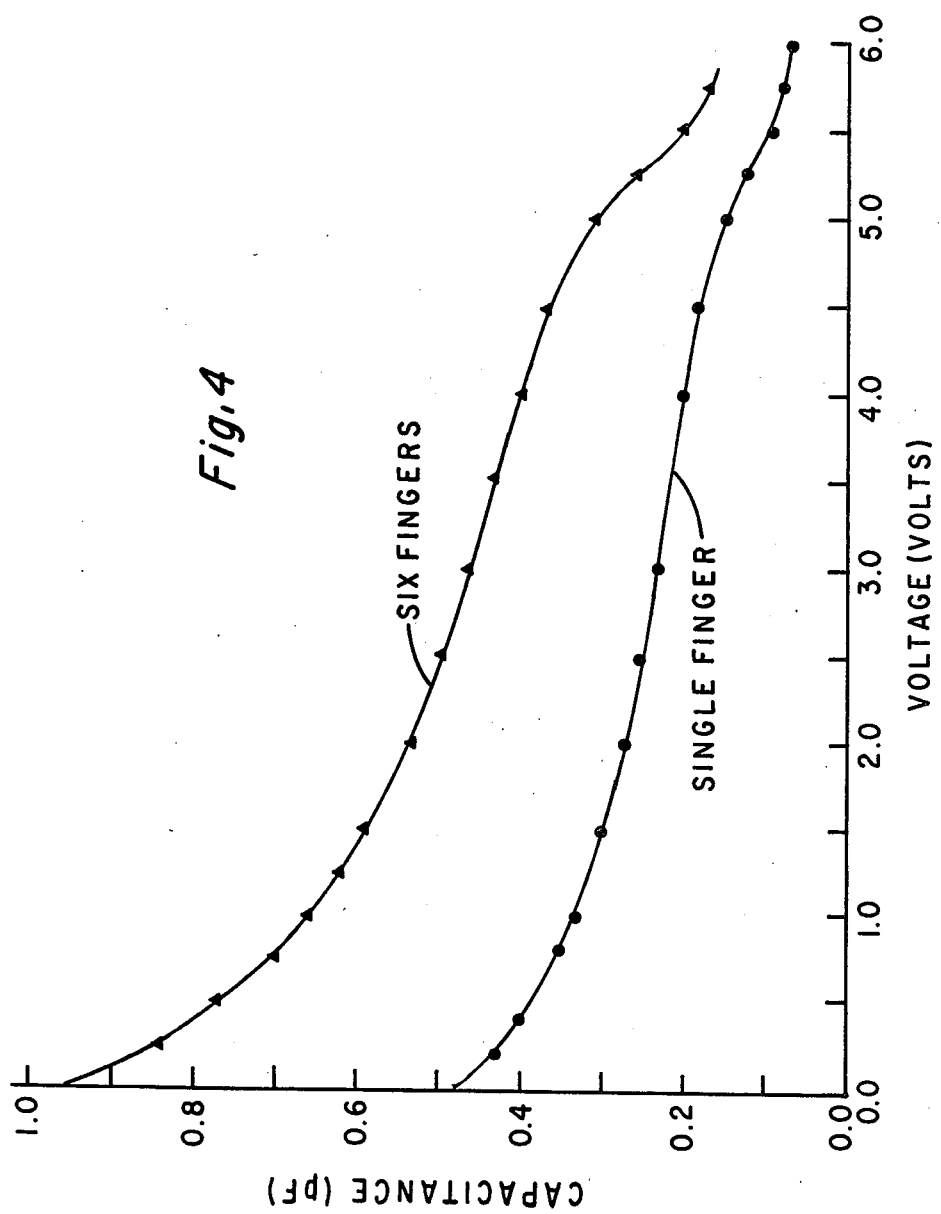
FIG. 4 compares the capacitance/voltage characteristics of a single-finger and of a six-finger varactor suitable for use in the present invention; and, FIG. 5 shows first and second embodiments of a VCO according to the present invention.
Figure 6:
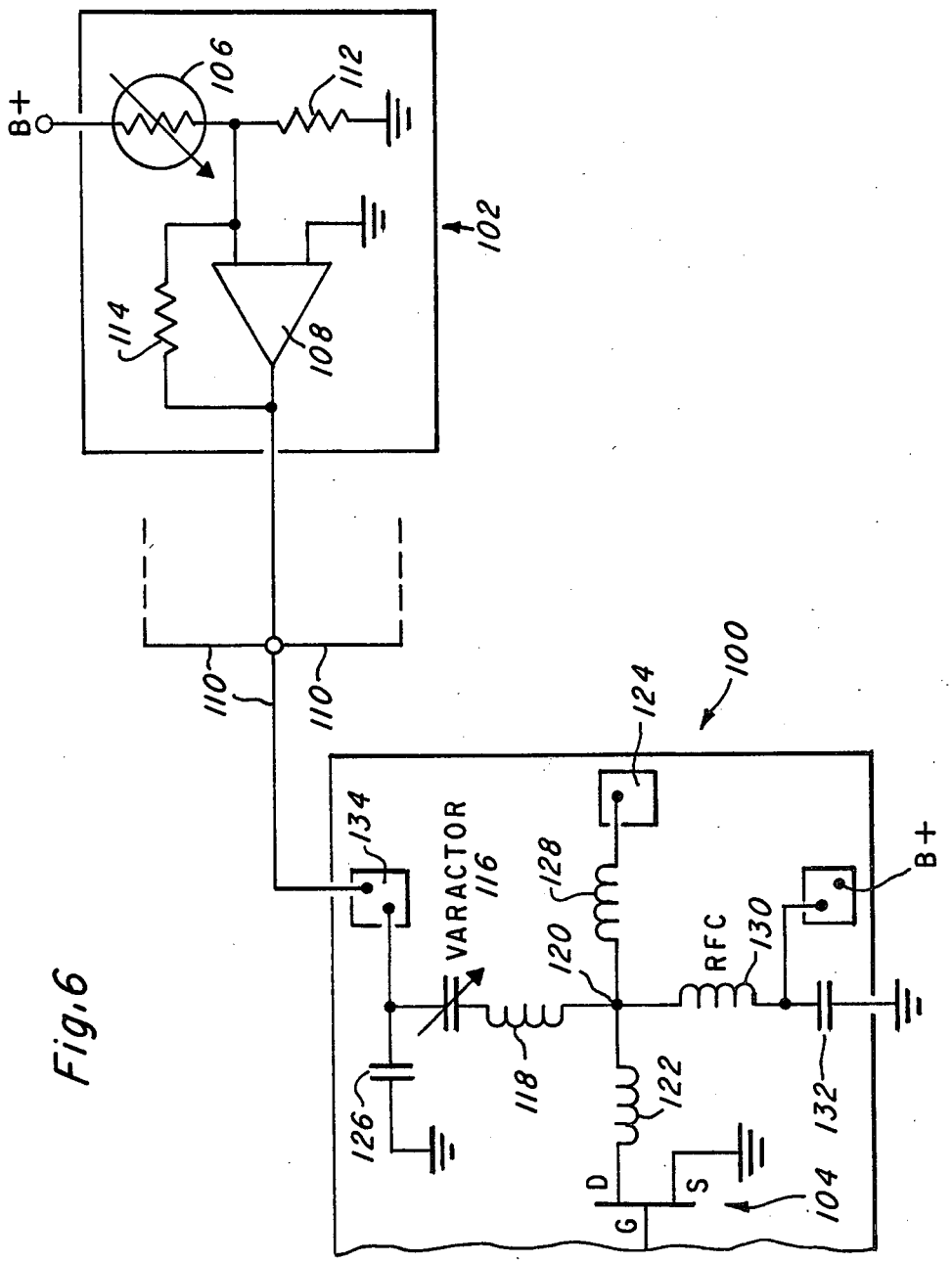

FIG. 3 shows the capacitance/voltage characteristics of a varactor constructed for use in the present invention. A 6 by 150 micron Ti/Pt/Au anode finger is placed between cathode areas two microns away. The layer 10 is 300 nm thick n-type ion implanted gallium arsenide, like that used for FETs. The substrate is chromium doped gallium arsenide. The anode is placed in a 100 nm etched recess, so that the anode is 200 nm above the substrate. In this embodiment, the capacitance decreases from 1.96 pF at 0 bias to 0.04 pF at −7 volts. This 49 to 1 capacitance ratio is achieved because of the extremely rapid capacitance decrease as punch through occurs between 5 and 7 volts. Calculated cutoff frequency for this diode is 28 GHz at 0 volts bias and 2.5 THz at 10 volts.

Of course, multi-finger embodiments of this planar varactor design may also be constructed.

The implantation parameters which optimize the n-type region 10 for construction of the varactor according to the present invention may be slightly different from those used to optimize the epitaxial layer for construction of FETs. For example, a slightly lower implantation dose (e.g. $3 \times 10^{12}/cm^2$) at a slightly higher energy (e.g. 400 KeV) would be used to construct a varactor according to the present invention, to obtain higher breakdown voltage. Thus, selective implantation of a monolithic chip containing both varactors and FETs would permit optimization of performance. However, the required characteristics for FETs and for the varactor according to the present invention are sufficiently close that, although selective implantation can provide a marginal advantage and performance, it is not required.

Passivation, in the presently preferred embodiment, is achieved by the following sequence of processing steps: First, the cathode metallization is deposited. Then 1000 Angstroms of silicon nitride are deposited over the whole surface of the device. The anode recess is then patterned and etched, to approximately ⅓ of the thickness of the layer 10. The anode metallization is then deposited, and any necessary contacts are then formed. Finally, 3000 Angstroms more of silicon nitride are deposited overall. Clean-up, at appropriate intermediate points of the process, is performed using, e.g., ammonium hydroxide and water.

To further improve varactor performance, by further increasing the breakdown voltage, additional steps may alternatively be inserted to reduce the density of surface states. For example, an additional etching step may be applied overall, after the anode has been deposited, or an additional reagent may be used for clean-up.

Nitride assisted lift-off, if used to form the anode 14, improves the breakdown voltage of the varactors of the present invention. This technique places the anode metal back from the edge of the etched recess, and passivates the surface of the gallium arsenide. The parameters for this process are well known to those skilled in the art. (see, e.g. Proceedings of the Cornell Conference on Microwave Semiconductor Devices, 1981, p. 157, "High Yield, Reproducible process Techniques for microwave GaAs FETs", G. E. Brehm, F. H. Doerbeck, W. R. Frensley, H. M. Macksey, and R. E. Williams).

As will be obvious to those skilled in the art, numerous modifications may be performed, within the scope of the inventive concepts described above, to construct a varactor for use in the present invention. For example, p-type material could be used in the layer 10, although different metal composition would be required to create a Schottky barrier contact. Other semiconductor materials could also be used, provided that a doped semiconducting layer was lattice-matched to a semi-insulating substrate.

Two embodiments of integrated microwave wideband VCOs according to the present invention are shown in FIG. 5. The VCO circuit 22, shown on the left, represents the presently preferred embodiment. The VCO 22 is a "common gate" oscillator, having loop inductors 54 and 56 and varactors 50 and 52 respectively connected from the gate and source terminals of FET 58 to RF ground. MIM capacitors 78 and 80 (each numeral 16pF) to ground are used for RF bypassing, and 2.5 kilohm GaAs resistors are included at 74 and 76 are included in the high impedance bias lines to help suppress low frequency oscillations, to aid in isolating the DC bias lines from RF, and to act as a DC current limit. Bonding pads 72 and 70 are respectively provided for the gate and source tuning varactor voltages and pad 66 for DC-grounding of the source 64. External means of biasing the drain 62 and of matching the drain output 68 to 50 ohms must be provided.

No DC return is provided for the gate, since the bias point for the gate is established by clipping the RF gate voltage. This occurs in the FET 58, as described below.

While the structure of the FET is in almost all respects conventional, it does have one important feature which cooperates in the novel operation of the VCO according to the present invention. The gate fingers form a Schottky barrier with the channel region, and thus RF voltages in the gate circuit are clipped by the Schottky barrier to form the necessary gate bias. This has the outstanding advantage that the gate tuning network in the present invention consists simply of the inductor 54 and the varactor 50, and other circuits normally required to establish the gate operating point, which would have high frequency resonances, are not included. This permits easy operation of a microwave oscillator over an extremely broad bandwidth.

Thus, the processing steps required to form the monolithic VCO in accordance with the present invention, as described above, are as follows: the starting material is an n-type epitaxial (or implanted) layer on a semi-insulating substrate, preferably n-type GaAs on a CR-doped GaAs substrate. (1). A mesa etch step is first. Photoresist is applied and patterned, and the epitaxial layer is then etched accordingly, to remove all portions of the epitaxial layer which are not needed. For example, portions of the epitaxial layer are left where the varactors 50 and 52 will be formed, and where the channel region of FET 58 will be formed. Portions of the epitaxial layer are also used to form the resistance elements 74 and 76. (2). Alignment marks are then deposited and etched, to provide E-beam control. A silicon nitride protective layer, of e.g. 1000 Angstroms, is then deposited only over the align marks. (Alignment marks are not shown within the VCO 22 of FIG. 5, but the positioning and use of E-beam alignment marks within a wafer is well known to those skilled in the art.) (3). Ohmic contacts are then formed. Photoresist is deposited and patterned to form the source and drain regions of FET 58, and the respective cathodes of varactors 50 and 52. Au/Ge/Ni is then deposited, lift-off is performed, and alloying is then performed, all conventionally. (4). The next stage is gate patterning. 1000 Angstroms of silicon nitride is deposited over all. E-beam resist is deposited, and E-beam patterning is then applied to define the gate fingers of FET 58 and the anode fingers of varactors 50 and 52. The silicon nitride in these patterns is then etched, and the epitaxial layer is then etched, to approximately one third of its thickness, where it has been exposed. Thus, where the epitaxial layers 3000 Angstroms thick, approximately 1000 Angstroms will be etched away in the present step. Ti/Pt/Au is then deposited, to form Schottky barriers to the epitaxial layer within these etched recesses, for the gate and anodes. Lift-off is then performed. (5). A first-level metallization step is then performed. 4000 Angstroms of silicon nitride is deposited overall, and photoresist patterning and etching of the nitride is performed (conventionally) to define the first metallization. This includes the bottom plate 82 of the capacitors 78 and 80, the inductors 54 and 56, the contact pads 66, 68, 70, and 72, and most of the remaining wiring. The patterning at this stage also exposes the source and drain fingers of the FET in the cathodes of the varactors 50 and 52, so that more metal is deposited on these structures to lower their resistance. Lift-off is then performed conventionally. (6). A top plate patterning step is then applied. First, 3000 Angstroms of silicon nitride are deposited overall. This nitride forms a passivating layer over the varactors 50 and 52, and also forms the dielectric layer of the two RF-grounding capacitors 78 and 80. The top plates of capacitors 78 and 80 are then patterned (using photoresist), and TiAu is then deposited. Lift-off is then conventionally performed. (7). Finally, air-bridge connections are formed. First, photoresist is patterned to form bias, where (e.g.) the air bridge 64 contacts the source contact 66, the middle source finger 84, and the source finger 86. Nitride etching is then performed where the bias have been patterned, and pure gold is deposited by sputtering. The photoresist is not removed, but is left in place, since it will be needed to support the air-bridge 64. A further layer of photoresist is then deposited, and patterned to form the actual air bridge connection, and gold is then deposited by electroplating. All photoresist is then stripped. As is well-known in the art, such air-bridge structures have the advantage of reducing stray capacitance. For clarity, only one air-bridge connection is shown in FIG. 5, (across the source fingers of FET 58), but air-bridge connections are also generally used to connect first- and second-level metallizations. Thus, air-bridges are also preferably formed between varactor 50 and the top plate of capacitor 78, and between varactor 52 and capacitor 80.

Thus, the monolithic VCO 22 is connected to a power supply across source terminal 66 and drain terminal 68, and provides oscillator output power at terminal 68. The source tuning terminal 70 and the gate tuning terminal 72 are used to provide bias voltages which respectively control the varactors 52 and 50. The varactor 50 is the primary tuning reactance for the VCO, and the varactor 52 is used to tune the source circuit, to provide optimal matching for broad-band capability.

The VCO 24 is generally similar, but the source-matching circuit is not included. The VCO 24 includes an FET 42, an inductance 40 and varactor 26 in the gate line of FET 42, and an RF-grounding capacitor 38 and a bias supply 32 and 34 connected to the cathode of the varactor 26. Since this VCO 24 does not have the source-matching circuit to provide wide-band impedance matching, its potential bandwidth is only about 25% of that of the VCO 22. However, the VCO 24 does provide two advantages over the VCO 22. First, the VCO 24 is physically smaller. Second, the VCO 24 is preferably operated in the common-drain mode, i.e. the polarities of the off-chip source and drain connections are reversed from those used with VCO 22. Where the VCO 24 is constructed with 300-micron total gate width, the source terminal provides an output impedance very close to 50 ohms, so that no separate impedance-matching is required. Thus, where the broad-band capabilitites of VCO 22 are not required, VCO 24 may be preferable. Like the VCO 22, the VCO 24 contains the innovative provision discussed above for gate bias, without any DC return line.

What we claim is:

1. A monolithic wideband microwave voltage-controlled oscillator (VCO), comprising:
    a semi-insulating substrate;
    a doped semiconducting layer above said substrate;
    an FET comprising a source and drain in said semiconducting layer, and a gate interposed between said source and said drain;
    an input contact connected to one of said source and said drain, and an output contact connected to the other of said source and said drain;
    a varactor, comprising a first terminal and second terminal atop said semiconducting layer, said first terminal forming a barrier contact with said semiconducting layer, the portion of said semiconducting layer beneath said first terminal being sufficiently thin and sufficiently lightly doped that punch through between said first terminal and said substrate occurs at a lower voltage then does breakdown between said first terminal and said second terminal; and means for providing a bias voltage, connected to a first one of said terminals of said varactor, said gate of said FET being direct current connected to the other one of said terminals of said varactor.

2. The VCO of claim 1, wherein said semi-insulating substrate comprises chromium-doped gallium arsenide.

3. The VCO of claim 2, wherein said doped semiconducting layer comprises n-type gallium arsenide.

4. The VCO of claim 3, wherein said doped semiconducting layer is less than one-half micron thick.

5. The VCO of claim 1, wherein said output contact is connect to said source.

6. The VCO of claim 5, wherein said source and drain each comprise respective pluralities of fingers, and said drain comprises a larger number of said fingers than does said source.

7. The VCO of claim 6, further comprising a capacitor including a first and second metal plates and a dielectric therebetween, said first plate of said capacitor being connected to said other one of said anode and said cathode of said varactor, and said second metal plate of said capacitor being connected to said drain of said FET.

8. The VCO of claim 7, further comprising an inductance interposed between said gate of said FET and said other one of said anode and said cathode of said varactor.

9. The VCO of claim 7, wherein said gate of said FET is connected to said anode of said varactor.

10. The VCO of claim 9, wherein the total length of said gate is approximately 300 microns.

11. The VCO of claim 1, wherein said source and said drain of said FET define a channel region therebetween within said semiconductor layer, and wherein said gate of said FET forms a Schottky barrier with the respect to said channel region.

12. The VCO of claim 11, wherein no pathway for DC return exists between said gate and said source or between said gate and said drain.

13. A monolithic wideband voltage-controlled oscillator (VCO), comprising:
    an output transistor, said output transistor comprising first, second and third terminals, wherein said transistor amplifies across said second and third terminals a signal provided thereto at said first terminal;
    a first varactor, said varactor being direct current connected to said first terminal of said transistor;
    first bias means, connected to said first varactor, for providing a first selected bias voltage thereto;
    a second varactor, direct current connected to said second terminal of said transistor;
    second bias means, connected to said second varactor for providing a second selected bias voltage thereto; and
    first and second RF ground connections, respectively connected to said first and second varactors respectively;
    said transistor and said varactors being integrated on a common monocrystalline substrate;
    whereby said third terminal of said transistor sustains oscillation.

14. The VCO of claim 13,
    wherein said first bias means provides said selected voltage to said first varactor for generally matching the frequency of said oscillation at said third terminal of said transistor to a desired frequency;
    and wherein said second bias means provides said second selected bias voltage to said second varactor for canceling the phase difference of oscillations at said desired frequency between said second terminal of said transistor and RF ground, to precisely match said oscillation frequency to said desired frequency.

15. The VCO of claim 14, wherein said respective RF ground connections comprise respective capacitors sharing a common layer of metallization.

16. The VCO of claim 14, wherein no pathway for DC return exists between said first and second nor between said first and third terminals of said transistor.

17. The VCO of claim 13, 14, 15 or 16, wherein said transistor and said varactors are all formed atop a common semi-insulating substrate.

18. The VCO of claim 17, wherein said transistor and said respective varactors are all formed within said semiconductor layer atop said substrate.

19. The VCO of claim 18, wherein each said varactor comprises:

an anode and a cathode formed on said semiconductor layer, said anode and cathode being coadjacent and spaced apart from each other, said anode forming a Schottky barrier with said semiconductor layer, the portion of said semiconductor layer beneath said anode being sufficiently thin and sufficiently lightly doped that punch through between said anode and said substrate occurs at a lower voltage than does breakdown between said anode and said cathode.

20. The VCO of claim 1, wherein said first terminal of said reactor is at least 2 microns wide.

21. The VCO of claim 1, wherein said first terminal of said reactor is at least 6 times as wide as said semiconducting layer beneath said first terminal is thick.

22. The VCO of claim 1, wherein all of the periphery of said first terminal of said first varactor is co-adjacent to respective corresponding portions of said second terminal said varactor.

23. The VCO of claim 1, wherein said semiconducting layer beneath said first terminal of said varactor is continuous with said semiconducting layer beneath said FET.

* * * * *

UNITED STATES PATENT AND TRADEMARK OFFICE
CERTIFICATE OF CORRECTION

PATENT NO. : 4,481,487
DATED : November 6, 1984
INVENTOR(S) : Gailon E. Brehm, Bentley N. Scott, David J. Seymour It is certified that error appears in the above-identified patent and that said Letters Patent is hereby corrected as shown below:

On the title page, item [75]:

Add David J. Seymour, Plano, Texas, as third named inventor.

Signed and Sealed this

Thirtieth Day of April, 1991

Attest:

HARRY F. MANBECK, JR.

*Attesting Officer*  *Commissioner of Patents and Trademarks*